(12) United States Patent
Jun et al.

(10) Patent No.: US 6,515,293 B1
(45) Date of Patent: Feb. 4, 2003

(54) METHOD AND APPARATUS FOR DETECTING THICKNESS OF THIN LAYER FORMED ON A WAFER

(75) Inventors: Chung-sam Jun, Hwasung-gun (KR); Sang-mun Chon, Seongnam (KR); Sang-bong Choi, Suwon (KR); Hyun-suk Cho, Suwon (KR); Pil-sik Hyun, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 72 days.

(21) Appl. No.: 09/671,207

(22) Filed: Sep. 28, 2000

(30) Foreign Application Priority Data

Oct. 6, 1999 (KR) .............................................. 99-43054

(51) Int. Cl.[7] .......................... G01N 21/86; G01V 8/00
(52) U.S. Cl. ........................... 250/559.27; 250/559.28; 250/559.04
(58) Field of Search ...................... 250/559.27, 559.28, 250/559.04; 356/630, 632, 516, 239.1, 612

(56) References Cited

U.S. PATENT DOCUMENTS 6,137,575 A  * 10/2000 Sugiyama et al. .......... 356/493

6,271,047 B1 * 8/2001 Ushio et al. .................. 438/14

FOREIGN PATENT DOCUMENTS

JP          9-133517         5/1997       ........... G01B/11/06

* cited by examiner

*Primary Examiner*—Robert H. Kim
*Assistant Examiner*—Courtney Thomas
(74) *Attorney, Agent, or Firm*—Volentine Francos, PLLC

(57) ABSTRACT

A method of measuring the thickness of a thin layer, by which the thickness of a top layer formed on the surface of a wafer can be detected in real time, and an apparatus therefor. This method includes irradiating light onto a cell and obtaining luminance from reflected light, detecting the thickness of a thin layer in an oxide site which is adjacent to the cell, repeating the irradiating and detecting steps to obtain a plurality of luminance values from cells formed on the wafer and a plurality of thickness values of thin layers in oxide sites that are adjacent to the cells, and employing a thickness calculation formula for calculating the thickness of a top layer using the plurality of luminance values and plurality of thickness values obtained in the prior steps. The thickness of a thin layer is directly detected from the luminance of light reflected by the cell, so that it can be precisely detected in a non-destructive manner, thus making it possible to detect the thickness of a thin layer in real time during the manufacture of a semiconductor device.

2 Claims, 5 Drawing Sheets

METHOD AND APPARATUS FOR DETECTING THICKNESS OF THIN LAYER FORMED ON A WAFER

BACKGROUND OF THE INVENTION

1. Field of the Invention

The present invention relates to a method of detecting the thickness of a thin layer and an apparatus therefor, and more particularly, to a method of detecting the thickness of a thin layer formed on the surface of a semiconductor wafer, and an apparatus therefor.

2. Description of the Related Art

As the level of integration of semiconductor devices increases, the thickness of a thin layer formed on a wafer is an important parameter that must be controlled in the manufacture of semiconductor devices. Failure to adjust the thickness of a thin layer to within a desired range causes degradation of the devices, and this degradation reduces the margins in a photolithography process, thereby causing a deterioration in the yield. Thus, precise and accurate detection of the thickness of the top layer over a specified portion of the surface of a wafer is considerably important.

The conventional optical detection method suffers some drawbacks. The actual detection of the thicknesses of patterned cells to be measured is difficult due to the optical interference of those patterns beneath the layer to be measured. This difficulty is exacerbated by certain measurement limitations/restrictions depending on the sizes of beam spots projected to the patterns. Hence, in the conventional detection method, the only instances where layer thickness can be accurately ascertained is for flat structures having no patterns beneath the layer to be measured.

In order to achieve such a detection, as shown in FIGS. 1 and 2, the thickness of a thin layer formed on a wafer 1, particularly, the thickness of the top layer 2 formed over cells B in which predetermined lower patterns 3 are formed, is detected from the thickness of an unpatterned adjacent oxide site A between the cells B, during a semiconductor manufacturing process. The size of the oxide site A is about 20×20 to 100×200 $m^2$ in consideration of the size of the beam spot. As is readily seen, in the conventional thickness detection method, the thickness of a thin layer 2 formed over cells B must be measured indirectly by estimating the thickness of a thin layer in the adjacent oxide site A, which means the thickness cannot be accurately detected. Thus, a vertical secondary electron microscope (VSEM) is employed to overcome a detection limit due to the above-described non-destructive thickness detection method. However, the use of the VSEM causes the breakdown of a wafer, thus preventing real time detection of the thickness. Moreover, with the above described measurement method, a large amount of analysis time is required to measure the thickness of a target.

SUMMARY OF THE INVENTION

An object of the present invention is to provide a method of accurately detecting the thickness of a thin layer by which the thickness of the top layer formed on the surface of a wafer can be non-destructively detected. An apparatus for performing such a method is also provided.

Another object of the present invention is to provide a method of detecting the thickness of a thin layer by which the thickness of the top layer formed over cell areas having patterns can be directly detected.

Still another object of the present invention is to provide a method of detecting the thickness of a thin layer by which the thickness of the top layer formed over cell areas can be non-destructively detected in real time.

Accordingly, to achieve the first object, the present invention provides a method of detecting the thickness of a thin layer, including the steps of: (a) irradiating light toward a cell formed on a wafer and obtaining a luminance value from reflected light reflecting from the cell; (b) detecting a thickness of a thin layer in an oxide site positioned adjacent to the cell; (c) repeating the steps (a) and (b) a plurality of times to obtain a plurality of luminance values from respective cells formed on the wafer and a plurality of thickness values of thin layers in oxide sites interposed between adjacent of the respective cells; (d) employing a thickness calculation formula for calculating the thickness of a thin layer using the plurality of luminance values and the plurality of thickness values obtained in the step (c); and (e) obtaining the calculated thickness of a top layer in a cell using the thickness calculation formula employed in the step (d).

In this present invention, it is preferable that light incident upon the cell is white light. It is also preferable that the luminance of light reflected by the cell is detected by dividing the reflected light into red and/or green light and obtaining the luminance of each divided light.

Alternatively, light incident upon the cell may be monochromatic light, for example, red light or green light. In this case, the luminance of reflected green or red light can be directly obtained without dividing the reflected light into light of specific colors.

To accomplish the above objects, the present invention also provides an apparatus for detecting the thickness of a thin layer, including: a light source for irradiating light onto a wafer provided with cells having predetermined lower patterns, and an oxide site interposed between adjacent cells; a camera for receiving light reflected by the cells of the wafer; a luminance measurer for measuring the luminance from a picture signal output by the camera; and a thin layer thickness calculator for calculating the thickness of a top layer in the cells using the luminance obtained by the luminance measurer.

Here, it is preferable that the thin layer thickness calculator calculates the thickness of the top layer in the cells of the wafer by applying the luminance of light reflected by a plurality of cells on a sample wafer which have the same structure as the cell of the detection target wafer, and the thickness values of oxide sites that are adjacent to each cell.

Also, the light source irradiates white light or monochromatic light, preferably, green light or red light. When the light source irradiates white light, the color luminance measurer divides the white light into green and/or red light and calculates the average luminance of each color light. On the other hand, when the light source irradiates monochromatic light, the color luminance measurer directly obtains the average luminance of the monochromatic light. The thickness calculator calculates the thickness of the top layer in a cell by substituting the received mean luminance values for each color in the thickness calculation formula.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENT

The present invention is based on the fact that the intensity of reflected light of each color periodically varies depending on the thickness of a cell, particularly, the thickness of a thin layer formed on a cell area, when light is projected onto the cell area. That is, the present invention non-destructively detects the thickness of a thin layer formed on the surface of a wafer, particularly, the thickness of a thin layer formed on a cell area, using the fact that the characteristics of reflected light vary depending on the state of a medium.

Figure 1:
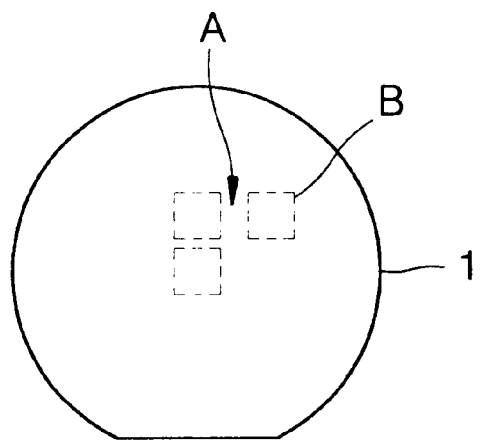
FIG. 1 is a plan view of a conventional wafer.
Figure 2:
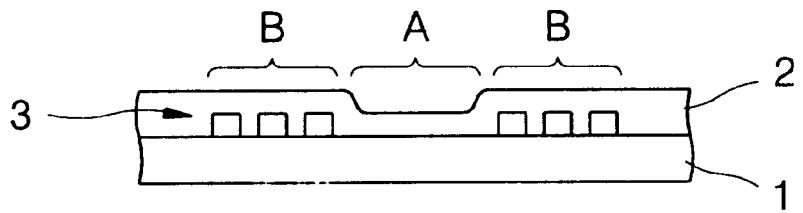
FIG. 2 is a partially-magnified cross-sectional view of the wafer shown in FIG. 1.
Figure 3:
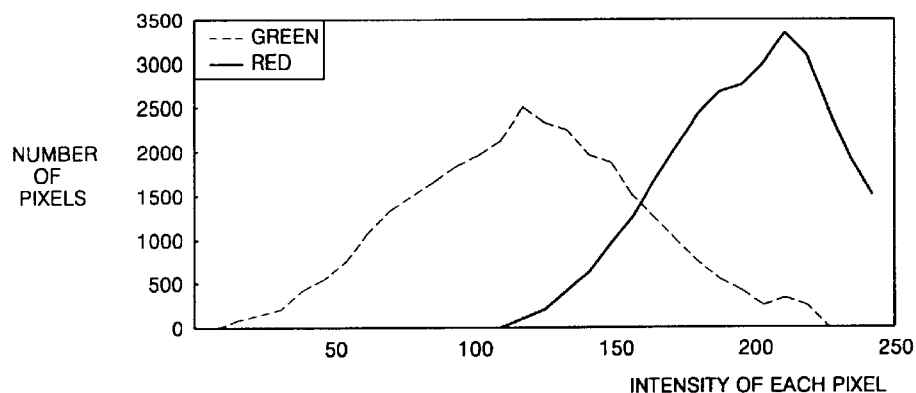
FIG. 3 is a graph showing variations of the number of pixels for each color with respect to the intensity of each pixel after a cell adjacent to an oxide site having a thickness of 13610 is photographed as a color image.
Figure 4:
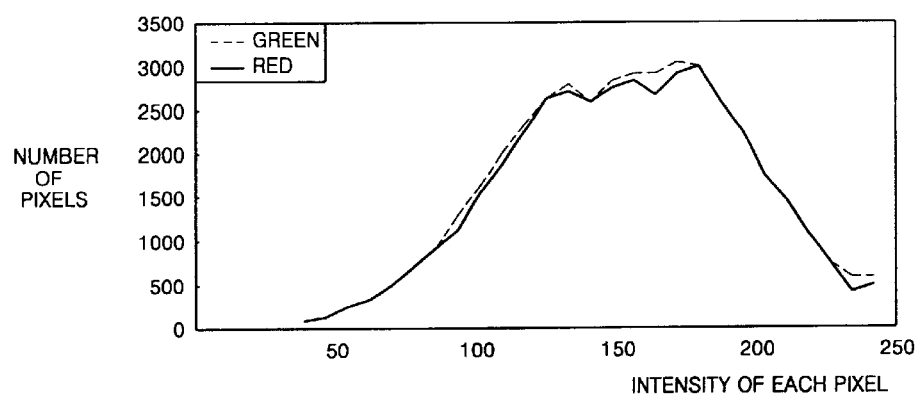
FIG. 4 is a graph showing variations of the number of pixels for each color with respect to the intensity of each pixel after a cell adjacent to an oxide site having a thickness of 13101 is photographed as a color image.
Figure 5:
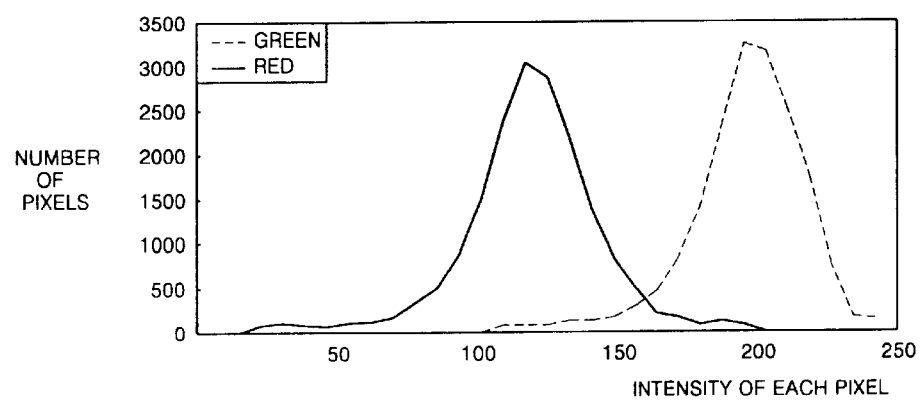
FIG. 5 is a graph showing variations of the number of pixels for each color with respect to the intensity of each pixel after a cell adjacent to an oxide site having a thickness of 12654 is photographed as a color image.

FIGS. 3 through 5 are graphs showing variations of the number of pixels for each color with respect to the intensity of each pixel after a cell is photographed as a color image after a chemical mechanical polishing (CMP) step in a process for manufacturing 4M high speed SRAM. Here, the vertical axis indicates the number of pixels, and the horizontal axis indicates an electrical signal for each pixel, that is, light intensity.

FIG. 3 illustrates the case in which an oxide site adjacent to cells has a 13610 thin layer, and where the intensity of green light is less than that of red light in light reflected by cells. For example, in the case of green light, slightly over 2500 pixels corresponds to an intensity of 110–120. In the case of red light, almost 3500 pixels corresponds to an intensity of around 220. While this result is based on a specific sample, it generally shows that the red light has greater brightness than the green light when the thickness of a thin layer is 13610.

FIG. 4 illustrates the case in which an oxide site adjacent to cells has a 13101 thin layer, and where the intensity of green light is similar to that of red light in light reflected by cells (compare with FIG. 3). That is, the red light and green light have a similar brightness when the thickness of a thin layer is 13101.

FIG. 5 illustrates the case in which an oxide site adjacent to cells has a 12654 thin layer, and where the intensity of green light is greater than that of red light in light reflected by cells (compare with FIG. 3). For example, in the case of red light, slightly over 3000 pixels corresponds to an intensity of 120–130. In the case of green light, almost 3300 pixels corresponds to an intensity of around 210. While this result is based on a specific sample, it generally shows that the green light has greater brightness than the red light when the thickness of a thin layer is 12654.

Figure 6:
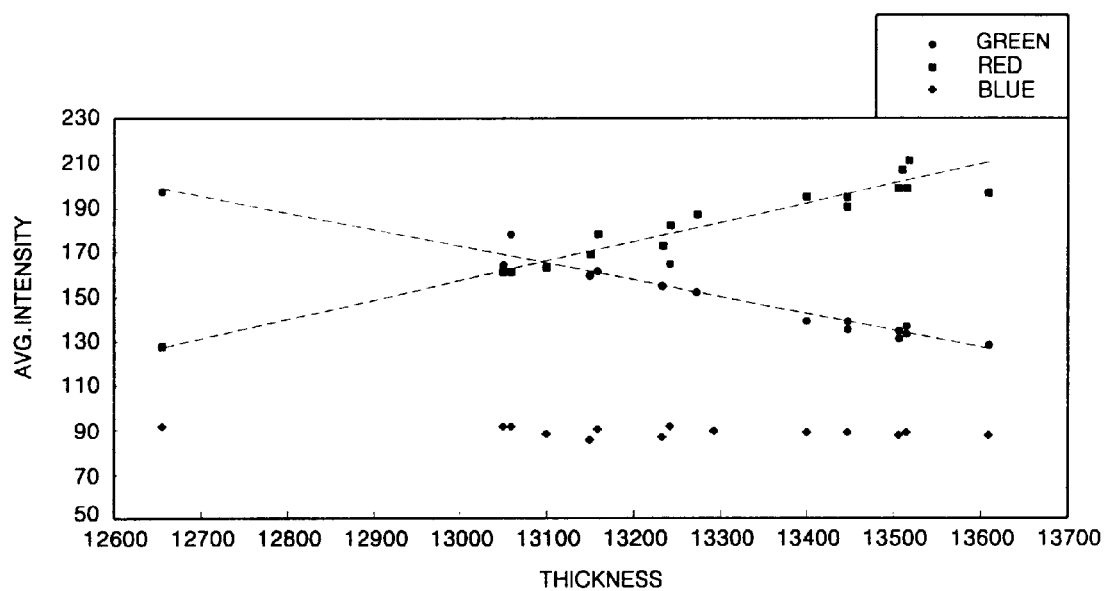
FIG. 6 is a graph showing variations of the average intensity for each color of light reflected by adjacent cells with respect to the thickness of an adjacent oxide site thin layer.
Figure 7:
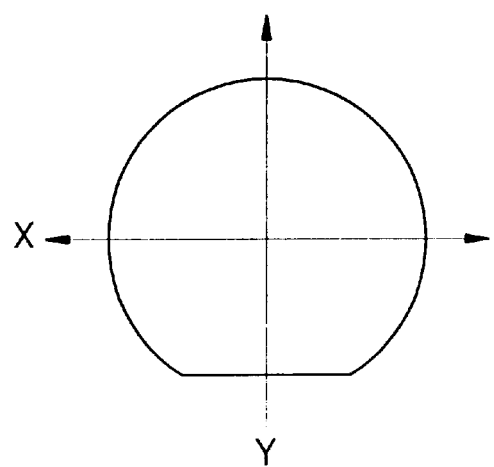
FIG. 7 is a plan view of a wafer, showing the scanning directions for obtaining the results of FIG. 6.

Referring to FIG. 6, as the thickness of a thin layer increases from 12600 to 13700, the average intensity of green light gradually decreases, the average intensity of red light gradually increases, and the average intensity of blue light remains at about 90 without significant change. As shown in FIG. 6, the average intensities of the red light and green light are similar in the range around 13100, which is the example depicted in FIG. 4. Note that FIG. 7 is a plan view of a wafer, showing the scanning directions for obtaining the results of FIG. 6.

The relationships in FIG. 6 exhibit a linearity of about 0.9257 between 12600 and 13700, thus approximately obtaining the following thickness calculating Equation 1:

$$Y=0.0963X-1098 \tag{1}$$

wherein X denotes the thickness of the top layer, and Y denotes luminance.

Thus, the thickness of the top layer, X, can be obtained from the luminance Y using the following Equation 2:

$$X=(Y+1098)/0.0963 \tag{2}$$

According to this result, it becomes evident that blue light cannot be used to detect the thickness of a thin layer, but that the thickness of a thin layer can be detected from the intensities of red light and green light using Equation 2. In particular, the intensity of both red light and green light change in relation to the thickness of a thin layer, so that the thickness of a thin layer can be detected from the intensity of both red light and green light.

Figure 8:
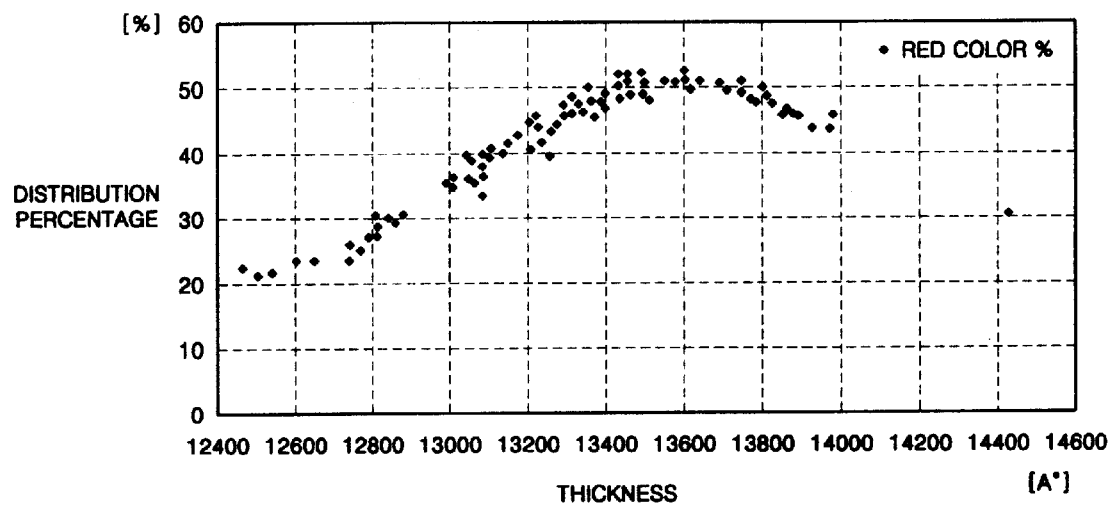
FIG. 8 is a graph showing variations of the distribution percentage of the intensity of red light among light reflected by adjacent cells with respect to the thickness of a thin layer in an oxide site.
Figure 9:
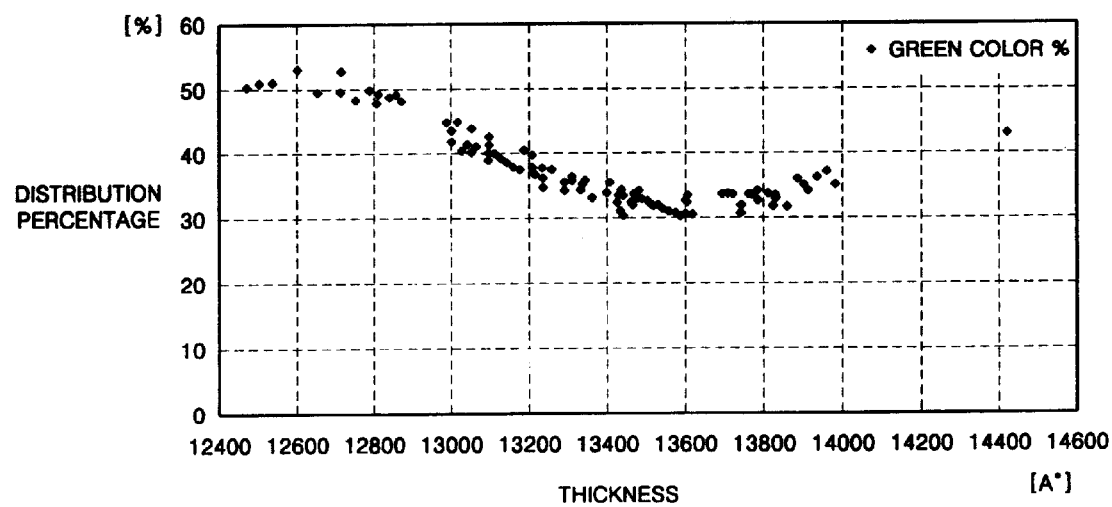
FIG. 9 is a graph showing variations of the distribution percentage of the intensity of green light among light reflected by adjacent cells with respect to the thickness of a thin layer in an oxide site.

The thickness of a thin layer corresponding to the intensity of red light and green light has constant periodical functional characteristics, as shown in FIGS. 8 and 9. The vertical axes in FIGS. 8 and 9 indicate the distribution percentages of the intensities of red light and green light among reflected light, respectively.

FIGS. 8 and 9 show a period of about 2000, that is, one reflective index. In each of the highest and lowest reflective indices, there is one thickness value for half of a period, but the other reflective indices have two thickness values for half of a period. For example, when the distribution percentage of the intensity of red light is about 50%, a thickness, 13600, is provided. When the distribution percentage of the intensity of red light is about 40%, two thicknesses, 13100 and 14100, are obtained. Likewise, when the distribution percentage of the intensity of green light is about 30%, a thickness, 13600 is provided. When the distribution percentage of the intensity of green light is about 40%, two thicknesses, 13100 and 14100, are provided. According to this result, in the cases of the highest and lowest reflective indices, the thickness of a thin layer can be accurately detected for half of the period, that is, within a range of 1000. In the case of all reflective indices except the highest and lowest reflective indices, the thickness can be accurately detected for a quarter of the period, that is, within a range of 500.

The above-mentioned period and distribution percentage vary according to the thickness, properties, and pattern beneath a thin layer to be detected. Thus, information required for actual measurement must be obtained from samples to be measured, before the above-described detection method according to the present invention is adopted. At this time, cell structures are maintained without change, and, while the thickness of a thin layer is varied, color information corresponding to the thickness thereof, particularly, the intensities of red light and green light, are acquired, thereby obtaining a corresponding approximate formula. This approximate formula is a function of the intensity for each color, and returns a thickness value corresponding to the intensity of each color. Here, this approximate formula is a periodical function having a predetermined period as shown in FIGS. 8 and 9, and returns two or four thickness values for one intensity value per period as described above. Therefore, when the period is 2000 as shown in FIGS. 8 and 9, if the allowed range of the target thickness of the top layer which is formed on a cell is adjusted within a maximum of ±1000, precise detection of the thickness of a thin layer can be achieved within this range.

The method of detecting the thickness of a thin layer as described above will now be summarized.

In the first step, light is irradiated onto a cell on a sample wafer having cells of a particular structure and a luminance value is obtained from the reflected light.

In the second step, the thickness of a thin layer is detected in an oxide site which is adjacent to the cell.

The third step repeats the first and second steps a plurality of times to obtain luminance values from cells existing on the wafer and the thickness values of thin layers in oxide sites that are adjacent to each cell.

In the fourth step, a thickness calculation formula is used to calculate the thickness of a thin layer from a luminance value using the luminance values and thickness values obtained in the third step.

In the fifth step, the thickness of the top layer is obtained in a cell from the luminance of light reflected by cells on a wafer which is under manufacture, using the thickness calculation formula obtained in the fourth step.

The thickness calculator calculates the thickness of the top layer in a cell by substituting the received mean luminance values for each color in the thickness calculation formula.

In these steps, it is preferable that white light is incident upon the cell. Also, in detecting the luminance of light reflected by a cell, it is preferable that red and/or green light among the reflected light is divided, and the luminance value of each divided light is obtained.

Also, light incident upon the cell can be monochromatic light, for example, green light or red light. In this case, the luminance of reflected green or red light can be directly obtained without dividing the reflected light into light of specific colors.

The thickness, corresponding to each color, of a thin layer in a cell is obtained by applying the luminance for each color to the thickness calculation formula, and the thicknesses obtained for each color are compared to each other. In this way, any errors or inconsistencies, such as an error between the thicknesses, can be detected.

Figure 10:
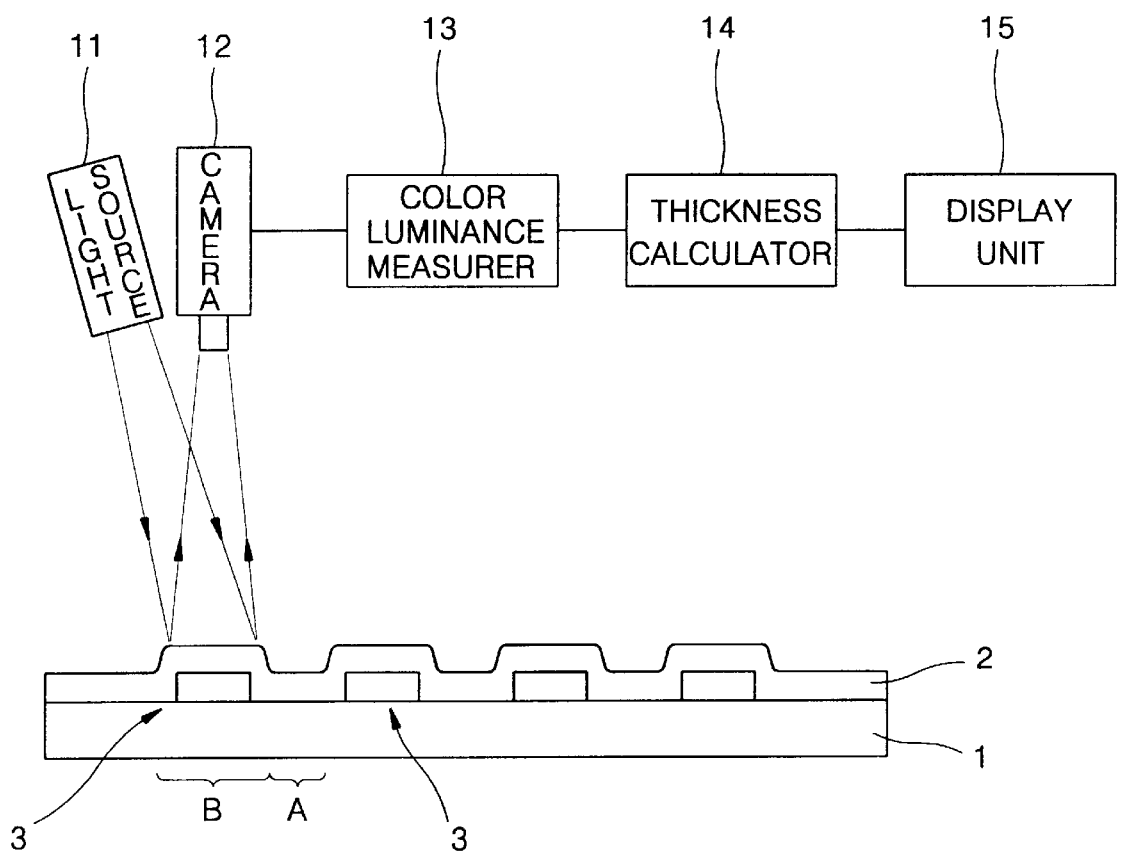
FIG. 10 is a schematic configuration diagram of an embodiment of an apparatus for measuring the thickness of a thin layer according to the present invention.

An apparatus for obtaining the thickness of the top layers in cells by adopting the thickness calculation formula obtained through the above steps, can have a structure such as that shown in FIG. 10. In this structure, a light source 11 is provided for irradiating light towards cells B on a wafer 1, on which an oxide site A is also formed between the cells B having a predetermined lower pattern 3. A camera 12 is provided for receiving light reflected by the cells B. A picture signal from the camera 12 is transmitted to a color luminance measurer 13. The color luminance measurer 13 calculates the average luminance for each color. The average luminance values obtained by the color luminance measurer 13 are transmitted to a thickness calculator 14. The thickness calculator 14 calculates the thickness of the top layer 2 in a specific cell B using the average luminance value obtained by a thickness calculation formula obtained in accordance with the above discussion. At this time, the obtained thickness is transmitted to and displayed on a display unit 15 as a picture.

In the above-described structure, the light source irradiates white or monochromatic light, particularly, green light or red light. When the light source irradiates white light, the color luminance measurer divides the white light into green and/or red light and calculates the average luminance of each color light. On the other hand, when the light source irradiates monochromatic light, the color luminance measurer directly obtains the average luminance of the monochromatic light. The thickness calculator calculates the thickness of the top layer in a cell by substituting the received mean luminance values for each color in the thickness calculation formula.

In the present invention described above, the thickness of a thin layer, particularly, the thickness of a thin layer in a cell, is directly detected from the luminance of light reflected by the cell, so that it can be precisely detected as compared to a conventional indirect detection method. Also, the thickness of a thin layer is non-destructively detected, and in particular, it is detected from the luminance values of the reflected light, thus making it possible to detect the thickness of a thin layer in real time during the manufacture of a semiconductor.

Although the invention has been described with reference to a particular embodiment, it will be apparent to one of ordinary skill in the art that modifications of the described embodiment may be made without departing from the spirit and scope of the invention.

What is claimed is:

1. A method of detecting the thickness of a thin layer, comprising:

(a) providing a sample wafer having a plurality of cells, an oxide site disposed laterally adjacent each of the cells, and a thin layer formed over the cells and each said oxide site adjacent thereto, each of the cells comprising a patterned layer disposed on a substrate, and the oxide site being devoid of the patterned layer;

(b) irradiating white light towards one of the cells of the sample wafer, collecting light reflecting from the cell, dividing the white light into components including red and green light, and obtaining respective values of the luminance of red and green components of the collected light;

(c) detecting the thickness of the thin layer at the oxide site adjacent the cell;

(d) repeating (b) and (c) a plurality of times to obtain a plurality of luminance values corresponding to the luminance of the green light from a plurality of the cells, respectively, a plurality of luminance values corresponding to the luminance of the red light from the plurality of the cells, respectively, and a plurality of thickness values corresponding to the detected thicknesses of the thin layer at the oxide sites adjacent the cells, respectively;

(e) using a plurality of luminance values obtained only in (d) and a plurality of the thickness values obtained in (d) to establish a thickness calculation formula for the green light and for the red light; and (f) determining the thickness of a top layer in a cell of a wafer of a device under manufacture using the thickness calculation formula for the green light and for the red light.

2. The method of claim 1, wherein (f) comprises determining a thickness of the top layer using luminance values corresponding to the luminance of the green light, and determining a thickness of the top layer using luminance values corresponding to the luminance of the red light, and further comprising comparing the thicknesses determined in (f) to one another.

* * * * *